United States Patent
Hogan

(10) Patent No.: US 10,698,038 B2
(45) Date of Patent: Jun. 30, 2020

(54) MULTICHANNEL GROUND FAULT TESTER

(71) Applicant: Siemens Industry, Inc., Alpharetta, GA (US)

(72) Inventor: Brian Joseph Hogan, Temecula, CA (US)

(73) Assignee: SIEMENS MOBILITY, INC., New York, NY (US)

( * ) Notice: Subject to any disclaimer, the term of this patent is extended or adjusted under 35 U.S.C. 154(b) by 311 days.

(21) Appl. No.: 15/729,752

(22) Filed: Oct. 11, 2017

(65) Prior Publication Data

US 2019/0107568 A1 Apr. 11, 2019

(51) Int. Cl.
G01R 31/02 (2006.01)
G01R 31/50 (2020.01)
B61L 27/00 (2006.01)
B61L 29/00 (2006.01)

(52) U.S. Cl.
CPC .......... G01R 31/50 (2020.01); B61L 27/0055 (2013.01); B61L 27/0088 (2013.01); *B61L 29/00* (2013.01)

(58) Field of Classification Search
CPC ..... G01R 27/18; G01R 31/024; G01R 31/025
See application file for complete search history.

(56) References Cited

U.S. PATENT DOCUMENTS

2013/0198245 A1* 8/2013 Kagan .................. H04L 67/06
707/812
2014/0117970 A1* 5/2014 Kitagaki ................ H02J 1/10
323/318

* cited by examiner

*Primary Examiner* — Tung X Nguyen

(57) ABSTRACT

A multichannel ground fault tester that can be connected to multiple individual circuits (or nodes isolated from each other within a circuit) at the same time. The circuits or nodes can be tested sequentially, or in any order, without manually disconnecting, moving and reconnecting the tester as is currently required when using a single-channel ground fault tester to test multiple circuits (or nodes isolated from each other within a circuit).

18 Claims, 6 Drawing Sheets

MULTICHANNEL GROUND FAULT TESTER

BACKGROUND

1. Field

Embodiments disclosed herein relate to ground fault testing and, more particularly, to a multichannel ground fault tester suitable for testing, among other things, railroad crossing equipment.

2. Description of the Related Art

At many roadway railroad crossings, pedestrian paths and sidewalks also cross the railroad track. Crossing gates, which typically are raised by default and lowered when a train approaches and crosses an intersection of a road and railroad track (i.e., a crossing), may be provided for roadway and pedestrian safety. In some instances, there may be separate gates for the roadway and the pedestrian path. For public safety reasons, it is essential that these crossing gates operate correctly.

Railroad crossing gates utilize electrical and mechanical components to ensure that the gates perform their intended functions correctly. One way to ensure that the crossing gates operate correctly is to make sure that its circuitry is properly isolated from ground or earth—i.e., the circuitry is not experiencing a ground fault. A ground fault occurs when an energized portion of a solidly-grounded electrical system becomes unintentionally connected with a path to ground or the earth. When this happens, the system phase-to-ground voltage can cause harmful and excessive levels of current to flow through the unintentional path or inadvertently provide energy to vital circuits thereby changing the intended state from restrictive to non-restrictive.

Existing ground fault testers (GFTs) have a single channel that tests a single circuit for isolation from ground. However, certain applications have multiple circuits or nodes within a circuit that require maintenance personnel to manually check each circuit/node, one at a time using the single channel GFT to ensure isolation from ground. As this testing is performed as part of regular maintenance activities, the manual testing becomes undesirably laborious, time consuming and expensive.

Accordingly, there is a need and desire for a ground fault tester that can monitor and test multiple circuits/nodes in an automated manner.

SUMMARY

Embodiments disclosed herein provide a multichannel ground fault tester that can be connected to multiple individual circuits (or nodes isolated from each other within a circuit) at the same time. The circuits or nodes can be tested sequentially, or in any order, without manually disconnecting, moving and reconnecting the tester as is currently required when using a single-channel GFT to test multiple circuits (or nodes isolated from each other within a circuit).

In one embodiment, a ground fault testing device is provided. The device comprises a signal generator adapted to output a test signal; a current sensor adapted to be connected to a first potential; and a plurality of channels connected to receive the test signal, each channel being adapted to connect the current sensor to a respective external circuit when placed in a first state and adapted to connect the current sensor to an internal circuit when placed in a second state. The current sensor is adapted to sense a level of a current flowing through each channel and its respective external circuit when each channel is placed in the first state.

In another embodiment, a ground fault testing apparatus is provided. The apparatus comprises a housing having a front panel; a signal generator within the housing and being adapted to output a test signal; a current sensor within the housing and being adapted to be connected to a ground potential via a first connection point through the front panel; a plurality of channels within the housing and being connected to receive the test signal, each channel being adapted to connect the current sensor to a respective external circuit via a respective connection point through the front panel when placed in a first state and adapted to connect the current sensor to an internal circuit when placed in a second state; a first circuit connected to the current sensor and comprising a plurality of indicators visible through the front panel of the housing, wherein the current sensor is adapted to sense a level of a current flowing through each channel and its respective external circuit when each channel is placed in the first state.

Further areas of applicability of the present disclosure will become apparent from the detailed description, drawings and claims provided hereinafter. It should be understood that the detailed description, including disclosed embodiments and drawings, are merely exemplary in nature intended for purposes of illustration only and are not intended to limit the scope of the invention, its application or use. Thus, variations that do not depart from the gist of the invention are intended to be within the scope of the invention.

BRIEF DESCRIPTION OF THE DRAWINGS

Like reference symbols in the various drawings indicate like elements

DETAILED DESCRIPTION

The components and materials described hereinafter as making up the various embodiments are intended to be illustrative and not restrictive. Many suitable components and materials that would perform the same or a similar function as the materials described herein are intended to be embraced within the scope of embodiments of the present invention.

The disclosed embodiments provide a multichannel ground fault tester that can be connected to multiple individual circuits (or nodes isolated from each other within a circuit) at the same time. The circuits or nodes can be tested sequentially, or in any order, without manually disconnecting, moving and reconnecting the tester as is currently required when using a single-channel GFT to test multiple circuits (or nodes isolated from each other within a circuit). The disclosed multichannel ground fault tester therefore automates testing of multiple circuits (or nodes isolated from each other within a circuit) and eliminates the need for maintenance personnel to manually connect the tester to each circuit/node, thereby reducing maintenance activities, labor time and costs.

It is known that isolation between circuits (e.g., signal lamps, relays, etc.) and ground is a common requirement in railroad and other electrical applications. The device used to test for and determine isolation is referred to as a ground fault tester. In the railroad industry, inspections for ground isolation can be done annually or continually if a ground fault tester is hardwired to the circuits to be checked. Typically, the circuits in question have a common return (e.g., negative, positive, neutral). As such, isolation testing between the common return and ground can be used to test for and identify an isolation failure (i.e., a ground fault).

Figure 1:
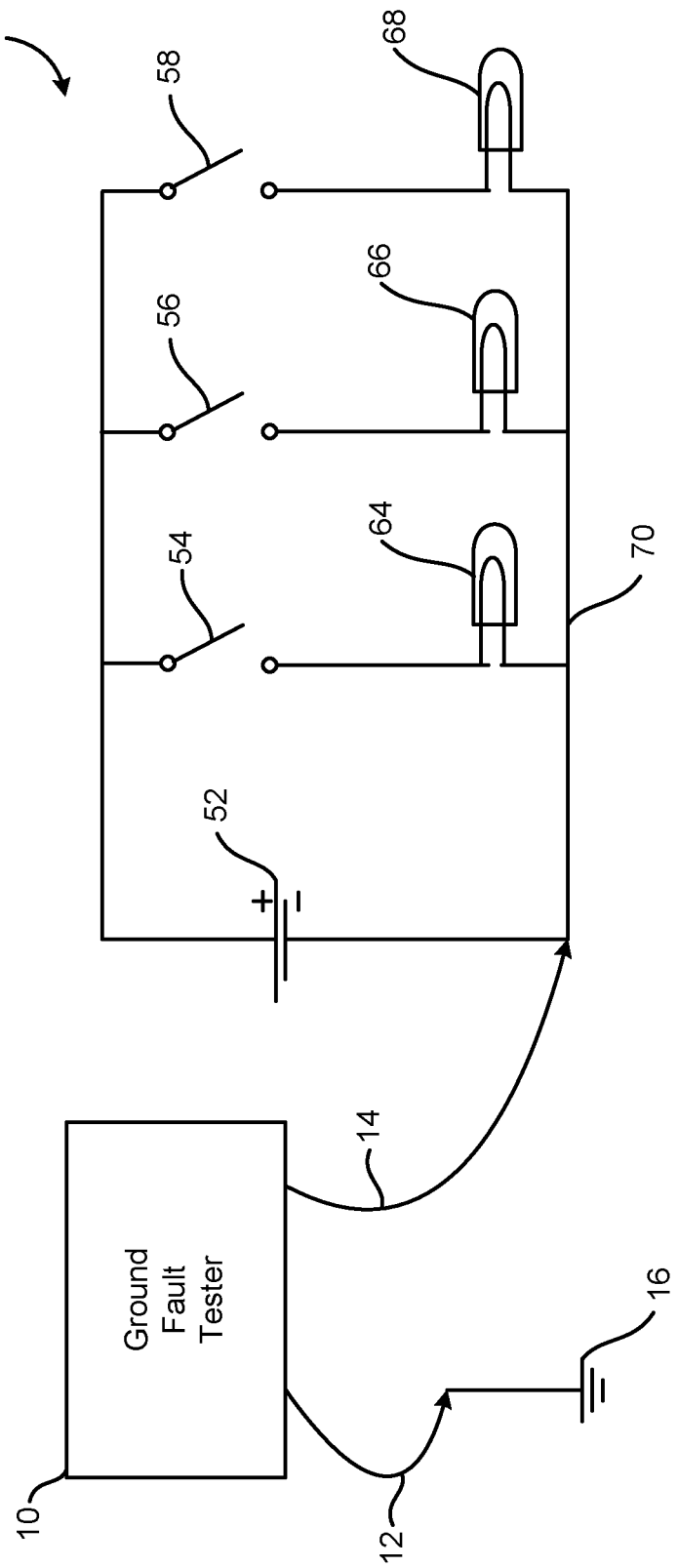
FIG. 1 illustrates an example of a single-channel ground fault tester connected to and testing a single electrical circuit.

FIG. 1 illustrates an example of a single-channel ground fault tester 10 connected to and testing an electrical circuit 50. The tester 10 has a first connection 12 to a ground potential 16 and a second connection 14 to a common return node 70 in the circuit 50. The connections 12, 14 could be e.g., cabled or wired leads that are clamped to or permanently hardwired to terminals or other connection points of the ground potential 16 or return node 70, respectively. Although not shown, the ground fault tester 10 typically comprises an indicator and/or alarm feature for providing an indication when there is a ground fault in the circuit 50 (i.e., lack of sufficient isolation in the circuit 50). Moreover, although not shown in FIG. 1, the ground fault tester 10 may comprise a digital and/or analog status output that may be attached to other monitoring and/or reporting equipment as is known in the art.

The example circuit 50 comprises a battery 52, a first relay 54 connected in series with a first signal lamp 64, a second relay 56 connected in series with a second signal lamp 66, and a third relay 58 connected in series with a third signal lamp 68. The battery 52 provides the path to node 70 for receiving and distributing a test signal to all of the battery positive terminal connections within the circuit 50. This way, the entire circuit 50 may be checked for a proper isolation from ground.

In operation, and as discussed below in more detail, the ground fault tester 10 applies a test signal to the circuit 50 via connection 14 and senses the level of the current flow within the circuit 50. If the level of the current flow is below a predetermined threshold level, the circuit 50 is deemed isolated by the tester 10. The tester 10 may provide an indication that the circuit 50 is properly isolated from ground. Suitable indications include, but are not limited to, illuminating a colored LED/light bulb on the tester 10 (e.g., a green LED/light bulb) or providing some other digital and/or analog output that can be transmitted to monitoring and/or reporting equipment.

If the level of the current flowing through the circuit 50 is not below the predetermined threshold level, excessive current is flowing through the circuit 50 and the tester 10 determines that the circuit 50 is not properly isolated from ground. The tester 10 may provide one or more indicators, alarms and/or outputs informing the user of the ground fault. Suitable indicators, alarms and outputs include, but are not limited to, illuminating/flashing a colored LED/light bulb on the tester 10 (e.g., a red LED/light bulb), providing an audible indication from the tester 10 (e.g., a bell or buzzer), or providing some other digital and/or analog output that can be transmitted to monitoring and/or reporting equipment.

Figure 2:
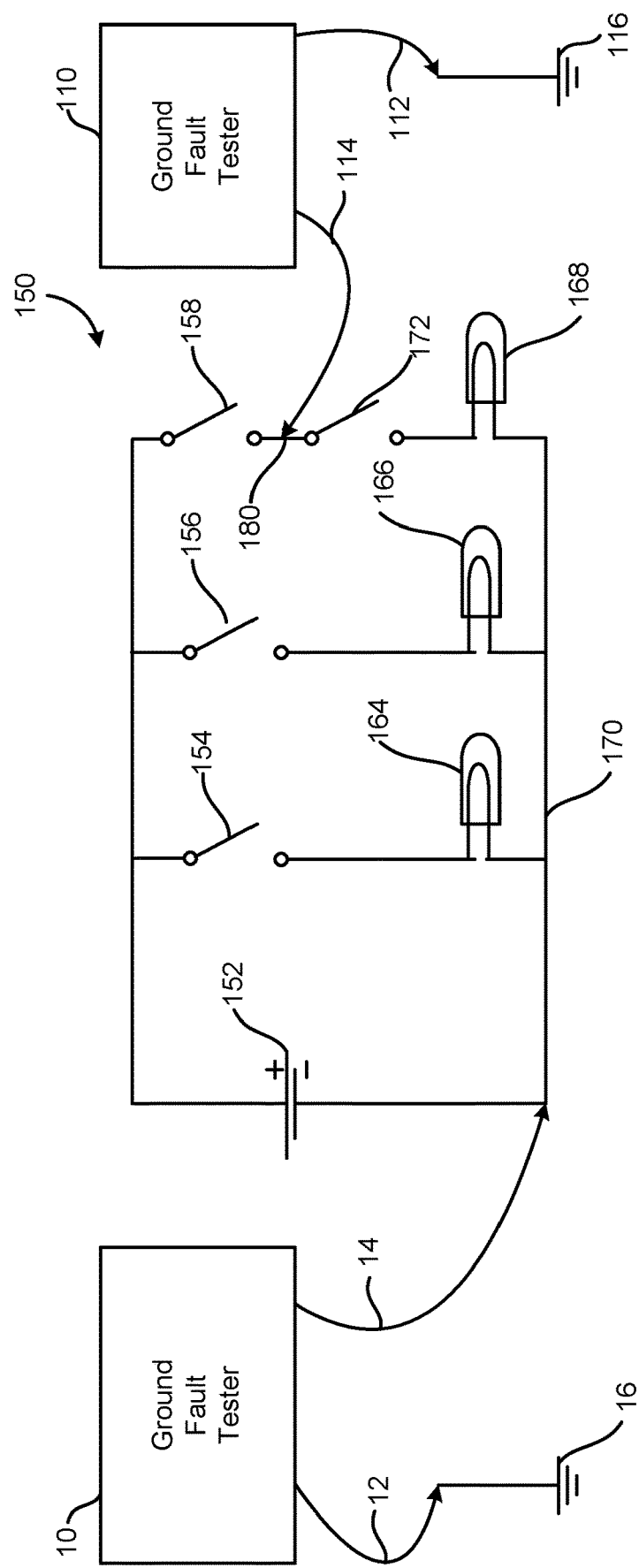
FIG. 2 illustrates an example of multiple single-channel ground fault testers, each respectively connected to and testing an individual circuit/node.

In contrast to the circuit 50 illustrated in FIG. 1, some circuits contain nodes that are isolated with respect to other nodes in the circuit, essentially forming additional individual circuits, requiring their own testing. This means that all of the circuit nodes cannot be checked for proper isolation from ground using one single-channel ground fault tester unless the tester is disconnected from the first circuit/ node and then connected to the second circuit/node. Alternatively, one or more additional ground fault testers can be connected to the individual circuits/nodes to monitor for ground faults. FIG. 2 illustrates an example where two single-channel ground fault testers 10, 110 are used to test separate nodes (i.e., separate circuits) within a circuit 150.

The example circuit 150 comprises a battery 152, a first relay 154 connected in series with a first signal lamp 164, a second relay 156 connected in series with a second signal lamp 166, and third and fourth relays 158, 172 connected in series with a third signal lamp 168. The third and fourth relays 158, 172 create a node 180 that is isolated from the rest of the circuit 150 and the first return node 170. Thus, all of the circuits/nodes of circuit 150 cannot be checked for proper isolation from ground using one single-channel ground fault tester unless the tester is disconnected from the first node 170 and then connected to the second node 180 or two separate testers 10, 110 are used as illustrated in FIG. 2.

In the illustrated example, the first tester 10 has a first connection 12 to a ground potential 16 and a second connection 14 to the first return node 170 in the circuit 150. The connections 12, 14 could be e.g., cabled or wired leads that are clamped to or permanently hardwired to terminals or other connection points of the ground potential 16 or return node 170, respectively. The second tester 110 has a first connection 112 to a ground potential 116 and a second connection 114 to the second return node 180. The connections 112, 114 could be e.g., cabled or wired leads that are clamped to or permanently hardwired to terminals or other connection points of the ground potential 116 or return node 180, respectively.

Although not shown, and as described above, each ground fault tester 10, 110 typically comprises an indicator and/or alarm feature for providing indications when there is a ground fault in the circuit/node being tested. Moreover, although not shown, each ground fault tester 10, 110 may comprise a digital and/or analog status output that may be attached to other monitoring and/or reporting equipment as is known in the art.

Figure 3:
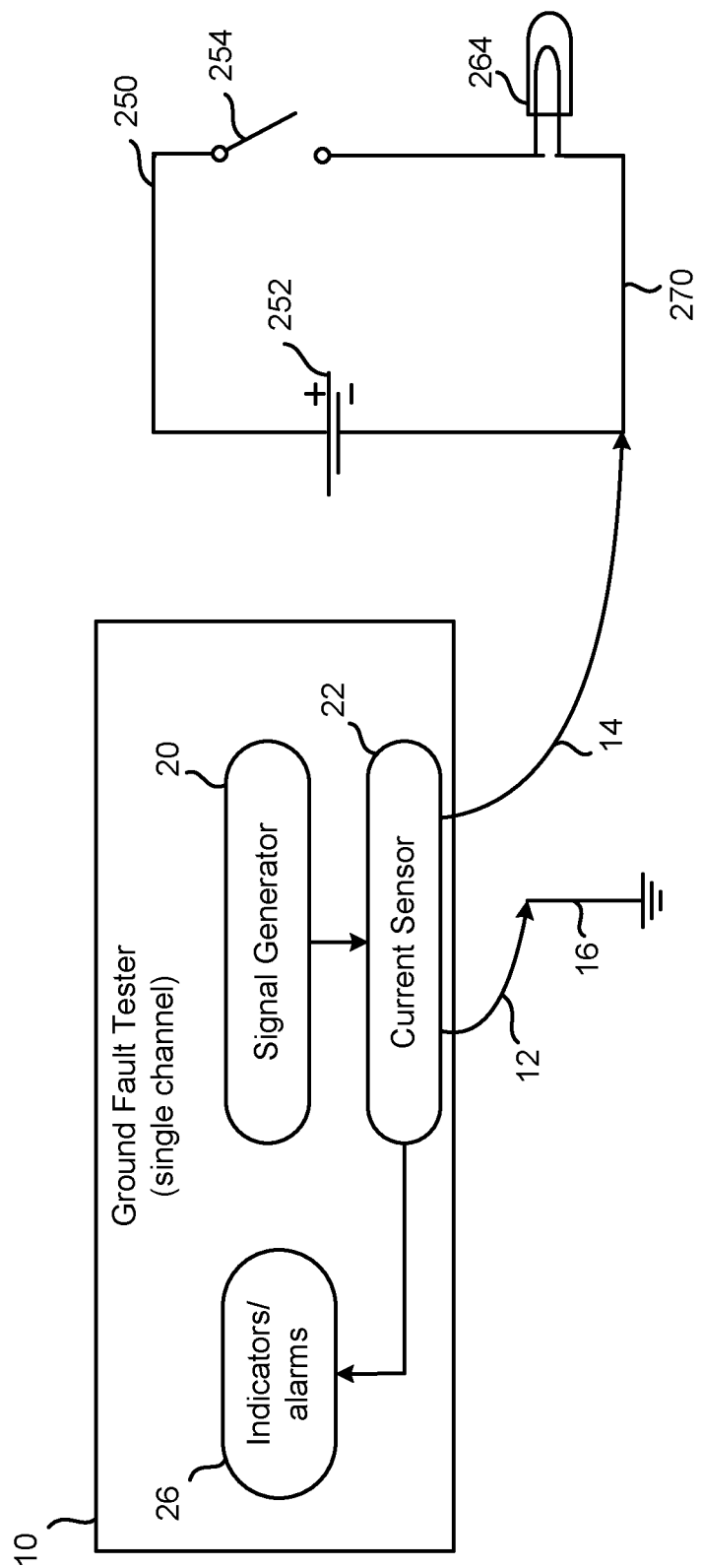
FIG. 3 illustrates the configuration of a single-channel ground fault tester and its connections for testing a single electrical circuit.

As can be appreciated, the number of individual ground fault testers required at some installations can be significant in terms of size and cost. Accordingly, a multichannel ground fault tester would be advantageous if size and cost were reduced. Ground fault testers generally follow the topology shown in FIG. 3, which illustrates the topology for the example ground fault tester 10 illustrated in FIGS. 1 and 2. The tester 10 includes a signal generator 20 electrically connected to a current sensor 22. The current sensor 22 is electrically connected to an indicators/alarms circuit 26 having one or more indicators/outputs as discussed above. Although not shown, the tester 10 may also include a processor, logic device (e.g., CPLC, FPGA) or other type of controller for controlling the operation of the signal generator 20, current sensor 22 and/or indicators/alarms circuit 26. The current sensor 22 is also connected to a ground potential 16 via a first connection 12 and to a return 270 of a circuit 250 via a second connection 14. The connections 12, 14 can be the type of connections discussed above. The example circuit 250 comprises a battery 252 and a relay 254 connected in series with a signal lamp 264.

In operation, the signal generator 20 outputs a test signal through the current sensor 22 and second connection 14 to the circuit 250. The current sensor 22 detects the level of the signal as it is applied to the circuit 250 and compares that level to a predetermined threshold level. If it is determined that the level of the current flowing through the circuit 250 is below the predetermined threshold level, the circuit 250 is deemed isolated. The current sensor 22 may provide an output to the indicators/alarms circuit 26, causing the circuit 26 to activate one or more indicators, and/or provide some other output, informing the user that the circuit 250 under test is properly isolated from ground.

If, however, the level of the current flowing through the circuit 250 is not below the predetermined threshold level, excessive current is flowing through the circuit 250 and the tester 10 determines that the circuit 250 is not properly isolated. The current sensor 22 provides an output to the indicators/alarms circuit 26, causing the circuit 26 to activate one or more indicators/alarms, and/or provide some other output, informing the user that the circuit 250 is not properly isolated from ground (i.e., the circuit 250 has a ground fault). Suitable indicators, alarms and outputs of circuit 26 are discussed above.

As can be appreciated, the signal generator 20 and current sensor 22 should be very precise to detect and analyze the extremely small current levels used during the testing of a circuit for isolation from ground. This means that the signal generator 20 and current sensor 22 will utilize high precision components, driving up the costs of the tester 10. Moreover, the tester 10 (particularly the signal generator 20 and current sensor 22) must employ some type of built-in self-testing to ensure that the tester 10 is operating properly. This is required to ensure that the tester 10 will be able to detect a ground fault as failure to do so would be dangerous. These requirements (i.e., precision and self-testing) drive up the size and cost of the tester 10. Accordingly, it is desirable and advantageous to have a single tester with the ability to test multiple circuits/nodes (i.e., a multi-channel tester) without duplicating the circuitry and components of the signal generator 20 and current sensor 22.

Figure 4:
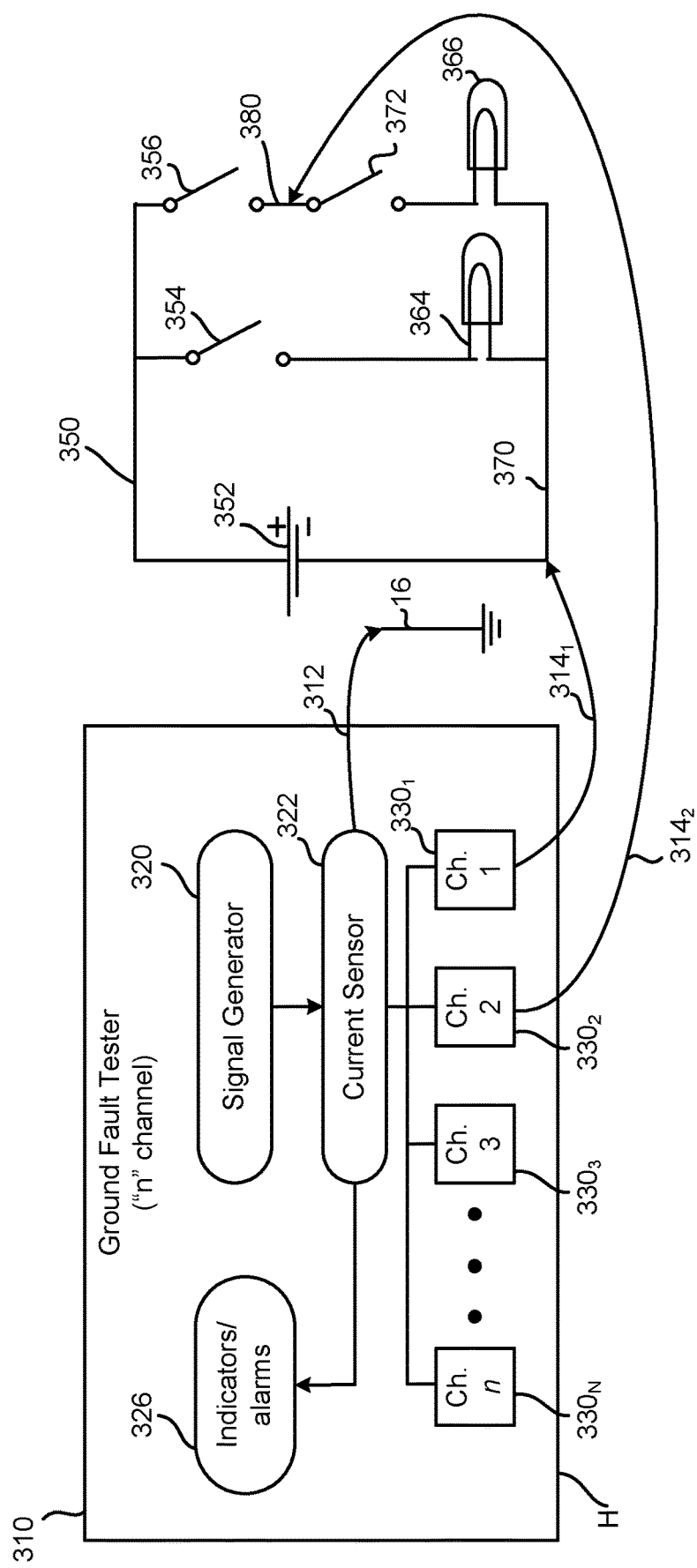
FIG. 4 illustrates the configuration of a multichannel ground fault tester constructed in accordance with the disclosed principles and its connections for testing multiple electrical circuits/nodes.

FIG. 4 illustrates the configuration of a multichannel ground fault tester 310 constructed in accordance with the disclosed principles and its connections for testing multiple electrical circuits/nodes within a circuit 350. In the illustrated example, the circuit 350 to be tested comprises a battery 352, a first relay 354 connected in series with a first signal lamp 364, and second and third relays 356, 372 connected in series with a signal lamp 366. The second and third relays 356, 372 create a node 380 that is isolated from the rest of the circuit 350 and a first return node 370.

The tester 310 includes a signal generator 320 electrically connected to a current sensor 322. The current sensor 322 is electrically connected to an indicators/alarms circuit 326 having one or more indicators/outputs as discussed above. Although not shown, the tester 310 may also include a processor, logic device (e.g., CPLC, FPGA) or other type of controller for controlling the operation of the signal generator 320, current sensor 322 and/or indicators/alarms circuit 326. All of the components of the tester 310 are preferably housed within a housing H.

The current sensor 322 is electrically connected via connection 312 to a ground potential 16. In addition, the current sensor 322 is electrically connected to a plurality of channels $330_1$, $330_2$, $330_3$, ... $330_n$ that can be connected to circuits/nodes in the circuit 350 via connections $314_1$, $314_2$, etc. In the illustrated example, a first channel $330_1$ is connected to the first node 370 via connection $314_1$ and a second channel $330_2$ is connected to the second node 380 via connection $314_2$. The multiple channels $330_1$, $330_2$, $330_3$, ... $330_n$ provide the tester 310 with the ability to test n number of circuits/nodes within the circuit 350 under test. In an example embodiment, the tester 310 may comprise 256 number of channels $330_1$, $330_2$, $330_3$, ... $330_n$ (i.e., n is 256). It should be appreciated that any number of channels $330_1$, $330_2$, $330_3$, ... $330_n$ can be used in the tester 350. Accordingly, the disclosed principles should not be limited to any specific number of channels $330_1$, $330_2$, $330_3$, ... $330_n$.

Figure 5:
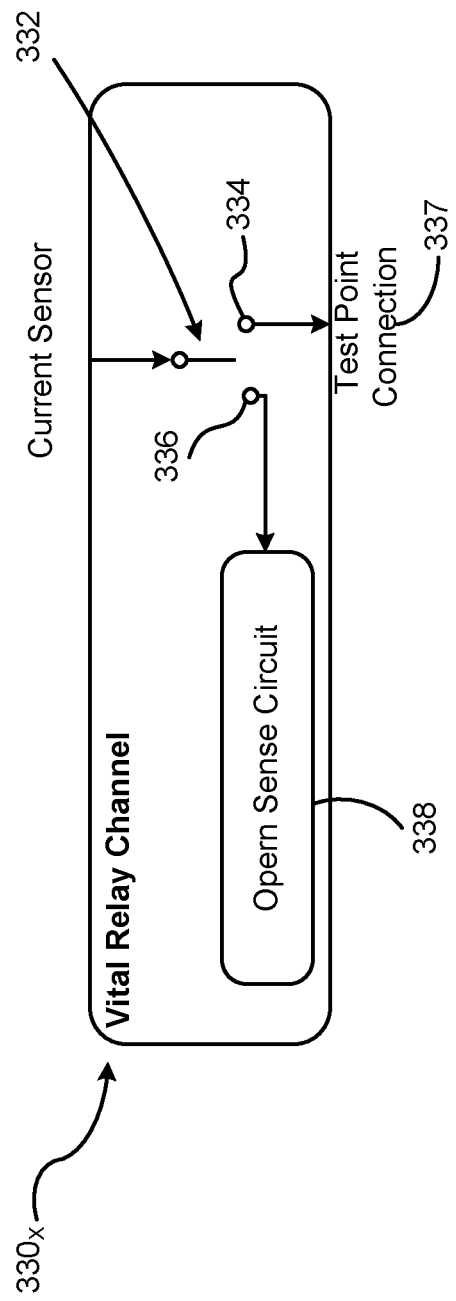
FIG. 5 illustrates an example of a vital relay channel used in the multichannel ground fault tester illustrated in FIG. 4.

As shown in FIG. 5, each channel $330_1$, $330_2$, $330_3$, ... $330_n$ (shown as channel $330_X$ in FIG. 5) includes a single-pole double-throw relay 332 and an open sense circuit 338. The relay 332 has a first state in which a first connection point 334 connects the current sensor 322 to a test point connection 337 attached to or formed as part of the tester's housing H. A cable, lead or other properly sized and configured connection mechanism (e.g., connection $314_1$) can be inserted into/attached to the test point connection 337 so that the channel's first relay connection point 334 can be connected to the test point (e.g., nodes 370, 380) within the circuit under test (e.g., circuit 350).

The relay 332 has a second state in which a second connection point 336 connects the current sensor 322 to the open sense circuit 338. The open sense circuit 338 provides an open circuit connection that will not interfere with the current sensor's 322 active connection (via connection point 334) to the circuit 350 under test. In one embodiment, the relay 332 is a vital relay suitable for use in a railroad application. One suitable vital relay is manufactured by Twinco MFG. Co., Inc. In this embodiment, the channel $330_1$, $330_2$, $330_3$, ... $330_n$ could be referred to as vital relay channel $330_1$, $330_2$, $330_3$, ... $330_n$.

Referring to FIGS. 4 and 5, the operation of the disclosed tester 350 is now described. During normal operation, each channel $330_1$, $330_2$, $330_3$, ... $330_n$ is activated one at a time, while the remaining channels $330_1$, $330_2$, $330_3$, ... $330_n$ are deactivated or remain deactivated. As used herein, a channel is activated when its relay 332 is placed in the first state (i.e., when the first connection point 334 connects the current sensor 322 to the test point connection 337) and is deactivated when its relay 332 is placed in the second state (i.e., when the second connection point 336 connects the current sensor 322 to the open sense circuit 338). This way only one activated channel $330_1$, $330_2$, $330_3$, ... $330_n$ is configured to test the it's respective external test point for isolation. In one embodiment, the channels $330_1$, $330_2$, $330_3$, ... $330_n$ are activated sequentially (i.e., channel $330_1$ is activated first, then deactivated while channel $330_2$ becomes activated, and so on up to channel $330_n$). In another embodiment, the channels $330_1$, $330_2$, $330_3$, ... $330_n$ are activated in another desired order.

Activation and deactivation of the channels $330_1$, $330_2$, $330_3$, ... $330_n$ will be controlled by a controller or the current sensor 322. The controller or current sensor 322 monitors the position of the relays 322 to ensure that they are in the proper state before testing is performed. If any relay 322 is not in the proper state, an error/malfunction has occurred and testing should be terminated. In this case, all relays 322 are deactivated, the connection to the ground potential is disconnected and the signal generator 320 is deactivated. The controller/current sensor 322 can send a signal to the indicators/alarms circuit 326, which outputs a "ground fault tester" failure (i.e., an indicator that the tester 310 itself has malfunctioned). In one embodiment, the indicators/alarms circuit 326 contains an indicator such as a colored LED or lamp (e.g., red LED or lamp) that alerts the user that the tester 310 has malfunctioned. This indicator would be in addition to the indicators alerting the user of isolation failures detected in the circuit 350 under test.

An activated channel $330_1$, $330_2$, $330_3$, . . . $330_n$ will have its relay 332 set to the first state (connecting its input from the current sensor 322 to the test point connection 337) while all other channels have their relays 332 set to the second state (connecting their input from the current sensor 322 to the open sense circuit 338). This means that only the activated channel will be connected to the circuit under test 350, allowing the current sensor 322 to detect and analyze the level of the current flowing through a specific circuit/node connected to the active channel. Detecting, analyzing and outputting the status of the current flowing through the activated channel can be done by any of the mechanisms discussed above.

Figure 6:
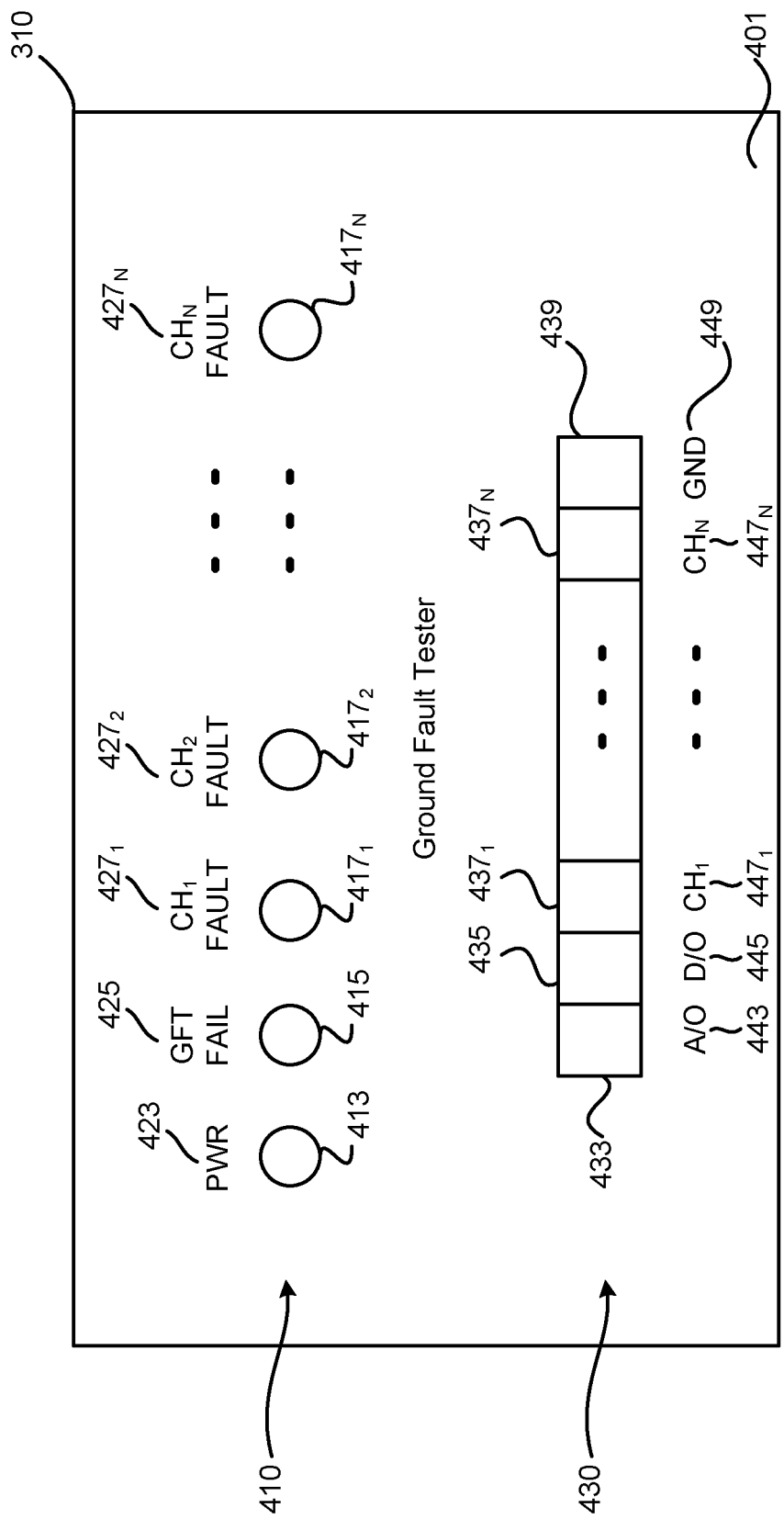
FIG. 6 illustrates an example front panel of the multichannel ground fault tester illustrated in FIG. 4.

FIG. 6 illustrates an example front panel 401 of the multichannel ground fault tester 310 illustrated in FIG. 4. In the illustrated example, the front panel 401 comprises a plurality of indicators 410 that are connected to the indicators/alarms circuit 326 illustrated in FIG. 4. Specifically, in the illustrated embodiment, there is a first indicator 413 that alerts the user if the tester 310 is powered on. The front panel 401 may also comprise a corresponding label 423 (e.g., "PWR") that informs the user what the first indicator 413 means. In the illustrated embodiment, the front panel 401 includes a second indicator 415 that alerts the user if the tester 310 itself has failed. For example, the second indicator 415 can be a red LED or lamp that is lit when the tester 310 has malfunctioned as explained above. The front panel 401 may also comprise a corresponding label 425 (e.g., "GFT FAIL") that informs the user what the second indicator 415 means.

In the illustrated embodiment, the front panel 401 includes one or more third indicators $417_1$, $417_2$, . . . $417_n$ that alert the user of the status of the circuits connected to channels $330_1$, $330_2$, $330_3$, . . . $330_n$. For example, these indicators $417_1$, $417_2$, . . . $417_n$ can be a multicolored LED or lamp that outputs a first color (e.g., green) when the channel is properly isolated from ground, but outputs a second color (e.g., red) when the channel is not properly isolated from ground. The front panel 401 may also comprise corresponding labels $427_1$, $427_2$, . . . $427_n$ (e.g., "$CH_1$ FAULT", "$CH_2$ FAULT", . . . "$CH_N$ FAULT") that informs the user what the third indicators $417_1$, $417_2$, . . . $417_n$ mean. It should be appreciated that only one indicator (and corresponding label) can be provided to alert that user that there is a ground fault somewhere in the circuit under test (as opposed to the individual indicators $417_1$, $417_2$, . . . $417_n$ and labels $427_1$, $427_2$, . . . $427_n$ illustrated in FIG. 6).

The front panel 401 also comprises a plurality of connection points 430 used to connect various portions of the tester's 310 internal circuitry to other components. For example, a first connection point 433 can be used to output an analog output from the tester 310 to an external device via an appropriate connection as explained above. The front panel 401 may also comprise a corresponding label 443 (e.g., "A/O") that informs the user what the first connection point 433 is used for. A second connection point 435 can be used to output a digital output from the tester 310 to an external device via an appropriate connection as explained above. A corresponding label 445 (e.g., "D/O") that informs the user what the second connection point 435 is used for may also be provided.

One or more third connection points $437_1$, . . . $437_n$ can be used to connect the tester's channels $330_1$, $330_2$, $330_3$, . . . $330_n$ to the circuit under test via an appropriate connection as explained above. The front panel 401 may also comprise corresponding labels $447_1$, . . . $447_n$ (e.g., "$CH_1$", "$CH_N$") that inform the user what the third connection points $437_1$, . . . $437_n$ are used for. A fourth connection point 439 can be used to connect the tester's current sensor 322 to a ground potential via an appropriate connection as explained above. A corresponding label 449 (e.g., "GND") that informs the user what the fourth connection point 439 is used for may also be provided.

It should be appreciated that the front panel 401 can comprise any number of indicators, alarms, connection points and labels as desired. Accordingly, the embodiments disclosed herein are not limited to the illustrated indicators, alarms, connection points and labels.

As can be appreciated, the disclosed multichannel ground fault tester 310 can be connected to multiple individual circuits (or nodes isolated from each other within a circuit) at the same time. The circuits or nodes can be tested sequentially, or in any order, without manually disconnecting, moving and reconnecting the tester 310 as is currently required when using a single-channel GFT to test multiple circuits (or nodes isolated from each other within a circuit). The disclosed multichannel ground fault tester 310 therefore automates testing of multiple circuits (or nodes isolated from each other within a circuit) and eliminates the need for maintenance personnel to manually connect the tester to each circuit/node, thereby reducing maintenance activities, labor time and costs.

Moreover, the disclosed tester 310 is capable of providing multiple testing channels $330_1$, $330_2$, $330_3$, . . . $330_n$, yet only requires the use of a single signal generator 320 and current sensor 322 to check multiple circuits for ground faults. As such, the tester 310 disclosed herein uses high precision components, yet does not further drive up the costs of the tester 310 since only one signal generator 320 and current sensor 322 are used. Moreover, the tester 310 employs a unique built-in self-test capability based on the use of the relays 332 in each channel $330_1$, $330_2$, $330_3$, . . . $330_n$, which ensures that the tester 310 is operating properly or shut down immediately if it is not.

The disclosed embodiments has been described as being suitable for use with and testing the equipment in railroad applications such as e.g., railroad crossing equipment. It should be appreciated, however, that the disclosed embodiments and principles can be used to test whether any circuit is properly isolated from ground. Accordingly, the disclosed embodiments and principles are not limited to the railroad industry or use in the railroad inductry.

The foregoing examples are provided merely for the purpose of explanation and are in no way to be construed as limiting. Further areas of applicability of the present disclosure will become apparent from the detailed description, drawings and claims provided hereinafter. While reference to various embodiments is made, the words used herein are words of description and illustration, rather than words of limitation. Further, although reference to particular means, materials, and embodiments are shown, there is no limitation to the particulars disclosed herein. Rather, the embodiments extend to all functionally equivalent structures, methods, and uses, such as are within the scope of the appended claims.

Additionally, the purpose of the Abstract is to enable the patent office and the public generally, and especially the scientists, engineers and practitioners in the art who are not familiar with patent or legal terms or phraseology, to determine quickly from a cursory inspection the nature of the technical disclosure of the application. The Abstract is not intended to be limiting as to the scope of the present inventions in any way.

I claim:

1. A ground fault testing device comprising:
a signal generator adapted to output a test signal;
a current sensor adapted to be connected to a first potential; and
a plurality of channels connected to receive the test signal, each channel being adapted to connect the current sensor to a respective external circuit when placed in a first state and adapted to connect the current sensor to an internal circuit when placed in a second state,
wherein the current sensor is adapted to sense a level of a current flowing through each channel and its respective external circuit when each channel is placed in the first state, and
wherein for each channel placed in the first state, the current sensor is adapted to compare the level of the current to a predetermined threshold level and determine whether the external circuit is isolated from a ground potential based on the comparison.

2. The device of claim 1, wherein the current sensor is adapted to place one channel of the plurality of channels in the first state and all other channels in the second state.

3. The device of claim 2, wherein the current sensor is adapted to sequentially place each channel of the plurality of channels in the first state.

4. The device of claim 1, further comprising an indicator circuit connected to the current sensor and comprising at least one indicator, wherein the current sensor is adapted to control at least one indicator to output a first indication when the external circuit is isolated from ground and a second indicator when the external circuit is not isolated from ground.

5. The device of claim 1, wherein each channel comprises:
a switching device; and
an open sense circuit,
wherein the switching device is controllable to a first position to connect the current sensor to the respective external circuit when placed in the first state and controllable to a second position to connect the current sensor to the open sense circuit when placed in the second state.

6. The device of claim 5, wherein the switching device is a vital relay.

7. The device of claim 5, wherein the current sensor is adapted to determine if the switching device is set to the first position when the channel is in the first state.

8. The device of claim 7, wherein if the current sensor determines that the switching device is not set to the first position when the channel is in the first state, the current sensor is adapted to deactivate the signal generator and disconnect the current sensor from the first potential.

9. The device of claim 8, further comprising an indicator circuit connected to the current sensor and comprising at least one indicator, wherein the current sensor is adapted to control the at least one indicator to output an indication representing a failure of the testing device.

10. A ground fault testing apparatus comprising:
a housing having a front panel;
a signal generator within the housing and being adapted to output a test signal;
a current sensor within the housing and being adapted to be connected to a ground potential via a first connection point through the first panel;
a plurality of channels within the housing and being connected to receive the test signal, each channel being adapted to connect the current sensor to a respective external circuit via a respective connection point through the front panel when placed in a first state and adapted to connect the current sensor to an internal circuit when placed in a second state;
a first circuit connected the current sensor and comprising a plurality of indicators visible through the front panel housing,
wherein the current sensor is adapted to sense a level of a current flowing through each channel and its respective external circuit when each channel is placed in the first state, and
wherein for each channel placed in the first state, the current sensor is adapted to compare the level of the current to a predetermined threshold level and determine whether the external circuit is isolated from a ground potential based on the comparison.

11. The apparatus of claim 10, wherein the current sensor is adapted to place one channel of the plurality of channels in the first state and all other channels in the second state.

12. The apparatus of claim 11, wherein the current sensor is adapted to sequentially place each channel of the plurality of channels in the first state.

13. The apparatus of claim 10, wherein the current sensor is adapted to control at least one of the plurality of indicators to output a first indication when the external circuit is isolated from ground and a second indicator when the external circuit is not isolated from ground.

14. The apparatus of claim 10, wherein each channel comprises:
a switching device; and
an open sense circuit,
wherein the switching device is controllable to a first position to connect the current sensor to the respective external circuit when placed in the first state and controllable to a second position to connect the current sensor to the open sense circuit when placed in the second state.

15. The apparatus of claim 14, wherein the switching device is a vital relay.

16. The apparatus of claim 14, wherein the current sensor is adapted to determine if the switching device is set to the first position when the channel is in the first state.

17. The apparatus of claim 16, wherein if the current sensor determines that the switching device is not set to the first position when the channel is in the first state, the current sensor is adapted to deactivate the signal generator and disconnect the current sensor from the first potential.

18. The apparatus of claim 17, wherein the current sensor is adapted to control at least one indicator of the plurality of indicators to output an indication representing a failure of the testing apparatus.

* * * * *